United States Statutory Invention Registration [19]

[11] Reg. Number: H101

Walker [45] Published: Aug. 5, 1986

[54] ULTRAVIOLET AND INFRARED FOCAL PLACE ARRAY

[75] Inventor: Clifford G. Walker, Huntsville, Ala.

[73] Assignee: The United States of America as represented by the Secretary of the Army, Washington, D.C.

[21] Appl. No.: 655,791

[22] Filed: Oct. 1, 1984

[51] Int. Cl.[4] ..... H01L 31/00

[52] U.S. Cl. ..... 357/30; 357/61; 357/4

[58] Field of Search ..... 357/30, 32, 31, 45, 357/61, 15; 250/338.01, 338.04, 370.01, 370.08, 372; 136/244, 255

[56] References Cited

U.S. PATENT DOCUMENTS

| | | | |
|---|---|---|---|
| 3,943,462 | 3/1976 | Thompson | 372/49 |
| 4,000,502 | 12/1976 | Bulter et al. | 250/370 |
| 4,092,659 | 5/1978 | Ettenberg | 372/49 |
| 4,297,720 | 10/1981 | Nishizawa et al. | 357/30 |
| 4,332,974 | 6/1982 | Fraas | 357/30 |

*Primary Examiner*—Stephen C. Buczinski

*Assistant Examiner*—Linda J. Wallace

*Attorney, Agent, or Firm*—Robert C. Sims; Freddie M. Bush; Anthony Thomas Lane

[57] ABSTRACT

The two-color focal plane array detects a target or image a target in the ultraviolet (UV) and infrared (IR) simultaneously. The system is a correlation, contrast or moving target tracker with very good countermeasure capability against a ground, sea, or airborne target. The tracker/seeker can be an all solid state no-moving parts configuration with the two focal plane devices of detectors aligned in their layer so as to be at an effectively cofocal.

1 Claim, 7 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

ULTRAVIOLET AND INFRARED FOCAL PLACE ARRAY

DEDICATORY CLAUSE

The invention described herein may be manufactured, used, and licensed by or for the Government for governmental purposes without the payment to me of any royalties thereon.

DESCRIPTION OF THE BEST MODE AND PREFERRED EMBODIMENT

Figure 1:
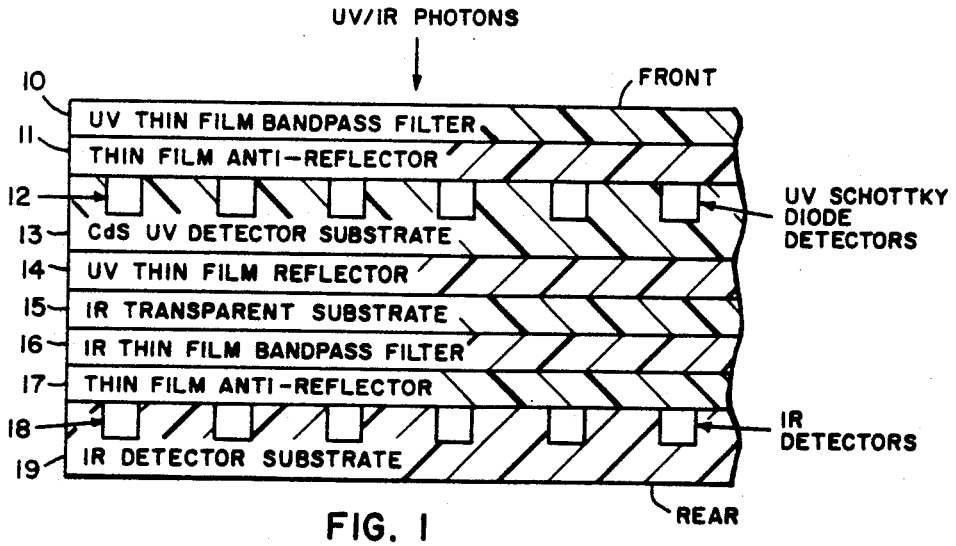
FIG. 1 is a side view of the present invention.
Figure 2:
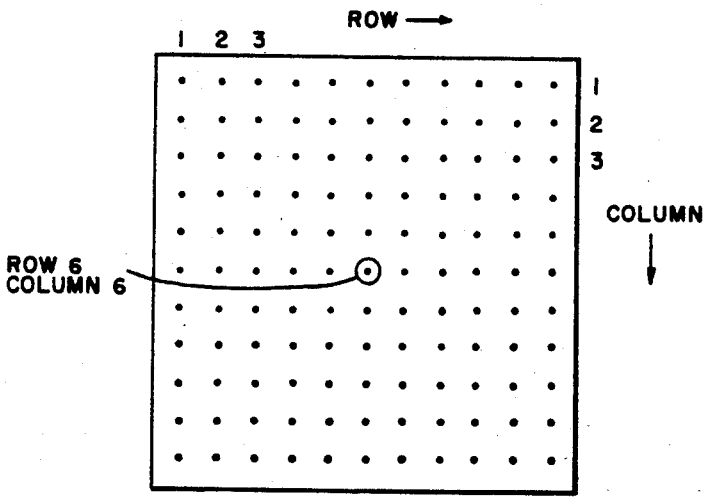
FIG. 2 is a top view showing the arrangement of the detectors.
Figure 3:
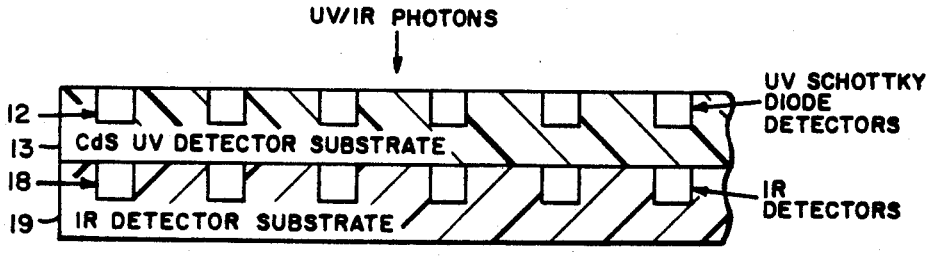
FIG. 3 is a side view of the array without thin films showing the present invention.

FIGS. 1–3 show a two-dimensional UV/IR (ultraviolet infrared) focal plane array which will be used to look out into space in two-dimension (azimuth and elevation). The sensor consists of cadimium sulfide (CdS) Schottky diode photovoltaic ultraviolet (UV) detectors 12 and a like number of infrared (IR) photoconductive or photovoltaic detectors 18. The UV detectors 12 are located in the front of the array and the IR detectors 18 are in the rear of the array. The distance between the front and back detectors are optically close, so that the two detectors are cofocal.

In order to increase the strength and rigidity of the arrays an IR transparent substrate 19 such as sapphire can be used (see FIG. 1). To increase the UV detector efficiency a thin film reflector 14 can be added between substrate 13 and 15 and a thin film anti-reflection coating 11 can be added on the front face of the UV detectors 12. In order to discriminate and limit the detected UV wavelengths, a UV thin film bandpass filter 10 can be added on the anti-reflection coatings 11 of the UV detectors. This UV bandpass filter could be located in the front optics if desired, and the thin bandpass would not be needed. The IR detected wavelengths can be limited and discriminated by adding an IR thin film bandpass filter 16 between substrates 15 and 19. Anti-reflection thin film coatings 17 can be added to the front faces of the IR Detectors 18 if necessary. The shape of the array can be circular or square or any other required shape.

FIG. 3 shows the basic device without the thin films. Although the detector elements 12 and 18 are aligned (they could be shifted slightly with respect to each other without substantial loss of circular logic), the signal input is of a size whereby more than enough IR radiation passes through detector 12 to activate detector 18. Substrates 13 and 19 can be made of any conventional charge-coupled device material such as gallium arsenide. Detector 12 is highly transparent to IR radiation.

FIG. 2 shows a top view of a 11 by 11 two dimensional array which could be used for detector 12 or 18. Row 6, column 6 is identified . Other shapes can be used.

Figure 4:
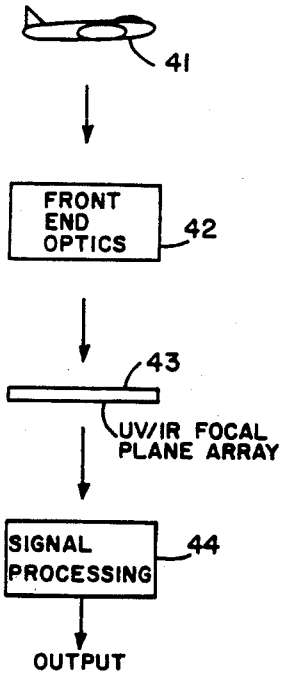
FIG. 4 shows a simplified engagement diagram for the focal plane array tracker system.

FIG. 4 shows the three main parts of the tracker/-seeker focal plane array configuration. The target 41 can be airborne or on the ground; moving or not moving. The front end optics 42 gathers the optical IR/UV energy and projects the energy on the focal plane array 43 at a pitch and yaw angle relative to the axis of the optics or body of the tracker/seeker. The optics can be any of the well known focusing devices and can be mirrors or lens or a combination of mirrors and lens. The shape of the array 43 and the number of detectors will depend on the specific application. The signal processor 44 can be bipolar, MOSFET, Junction FET, charge-coupled devices or charge injection devices and the output can be displayed or be the main parameter in a missile guidance control circuit.

One Complete Operation Cycle

Figure 5:
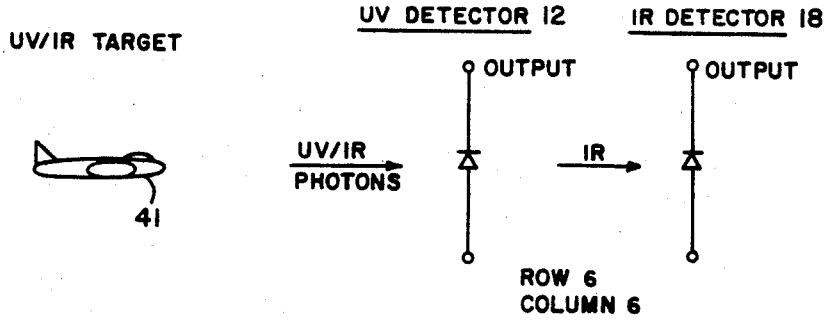
FIG. 5 is an illustration of a particular example of the use of the device.

A target has a UV background radiation wavelength of x micro-meters and emits an IR radiation wavelength of say 10x micro-meters. This UV/IR energy is gathered by the front optics 42 and is projected on the focal plane array as shown in FIG. 4. Assume the target 41 is at a long distance so that the target can be treated as a point source as shown in FIG. 5, and let the optics be aligned at the target so that the UV/IR radiation energy is focused on row 6, column 6 detector as shown in FIGS. 2 and 5. For an airborne target the preferred operation is as follows. Assuming a point source the UV/IR energy will be detected by detectors 12 and 18 in row 6 column 6 as shown in FIG. 5. The wavelengths of the detected energy will be determined by the respective bandpass filters as shown in FIG. 1. The CdS UV detector 12 is located in the front of the array because it is highly transparent to IR radiation and detects or absorbs most of the UV radiation.

Figure 6A:
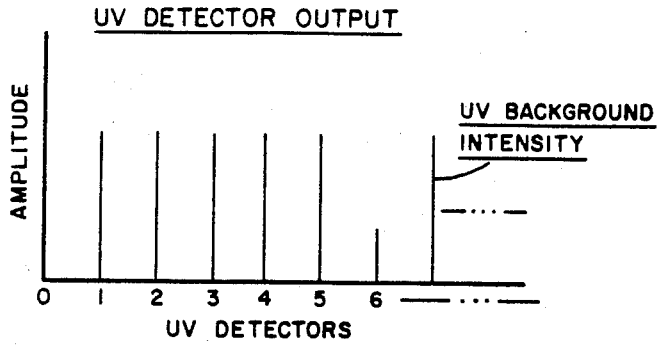
FIGS. 6A and 6B are diagrams illustrating the output amplitudes of the detectors in relationship to the specific illustration of FIG. 5.
Figure 6B:
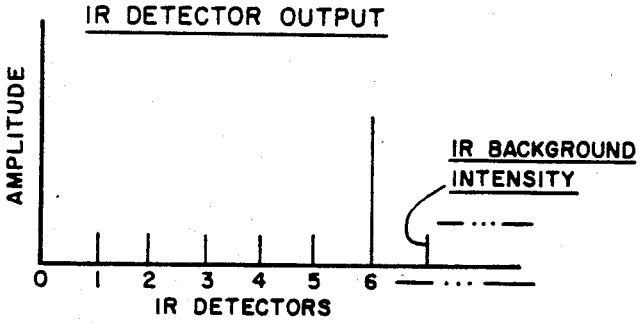

For an airborne target with UV background radiation present, the preferred detection operation is shown in FIGS. 5 and 6. The target 41 will block or greatly reduce the detected UV radiation; however, the detected IR radiation (FIG. 6B) will be much greater than the background IR radiation (FIG. 6A). The signal processor 44 processes these signals and determines that it is a true target when a given section of each detector (such as row 6, column 4) shows a relative low UV value and a relating high IR value. If the target attempt to jam the IR detector by emitting flares or other common methods, the signal processor will ignore these signals, because a true target is determined by the combination of a small UV detector output and a large IR detector output. Effective jamming of the UV detector with ths combination of radiations is not probable.

As the target comes closer to the tracker more detector elements will be involved in the detection and signal processing operation. Several detectors adjacent to row 6 column 6 detector could be involved in the detection process. In this case the signal processor will track the target using the centroid of the IR and UV detectors, and if a sufficient number of detectors are involved, an image can be developed and displayed. Other signal processing techniques are possible. Any of the well known signal processors can be used with proper programming design.

The system can be an anti-missile weapon system where the missile is guided inertially to a point in space, and then the seeker guides the missile onto the target. The inertial and seeker system could be all solid-state construction and could withstand a high-g environment. A shorter range application, using the same engagement technique, is a Chaparral type weapon system. If a connection with the missile is made so that the output of the Focal Plane Array (FPA) is displayed on the gunners Forward Looking Infrared (FLIR), along with the targets, then it would be possible to select a target for each missile and fire all missiles at the same time or rapid fire all missiles for close-in targets. For longer range targets, using the FLIR to select targets and knowing the range, the missile inertial system could be used to place the missiles in a target intercept path and then let the seeker guide to the target after the seeker acquires the target. All the missiles could be launched at the time or rapid fired if desired.

In a manportable short range application such as the STINGER-POST weapon system the inertial part of the system would not be needed. If a connection is made with the missile and the output of the FPA is displayed on a gunners video screen, then a target in the IR or UV or both could be selected. In this case a considerable cost savings would result because a night sight would not be needed.

I claim:

1. In a device comprising a plurality of first detectors arranged in a plane so as to constitute a first layer; said first detectors detecting a first band of radiation; a plurality of second detectors arranged in a plane so as to constitute a second layer; said second detectors detecting a second band of radiation; said first and second layers being arranged one on top of the other; said device senses radiation which flows through said first layer into said second layer; said plurality of first detectors being substantially transparent to said second band of radiation; said plurality of first and second detectors each constitute an array of detectors in its layer; a front end optics for focusing incoming radiation onto said first and second layers; said first band of radiation is ultraviolet; said second band of radiation is infrared; said plurality of first detectors are cadmium sulfide ultraviolet detectors arranged in a thin film substrate; and said plurality of second detectors are infrared detectors arranged in a thin film substrate.

* * * * *